United States Patent
RaghuRam

(10) Patent No.: US 7,291,907 B2
(45) Date of Patent: Nov. 6, 2007

(54) CHIP STACK EMPLOYING A FLEX CIRCUIT

(75) Inventor: Siva RaghuRam, Germering (DE)

(73) Assignee: Infineon Technologies, AG, Neubiberg (DE)

( * ) Notice: Subject to any disclaimer, the term of this patent is extended or adjusted under 35 U.S.C. 154(b) by 172 days.

(21) Appl. No.: 11/066,555

(22) Filed: Feb. 28, 2005

(65) Prior Publication Data

US 2006/0192277 A1 Aug. 31, 2006

(51) Int. Cl.
*H01L 23/02* (2006.01)
*H01L 23/49* (2006.01)
*H01L 23/48* (2006.01)
*H01L 23/52* (2006.01)
*H01L 29/40* (2006.01)

(52) U.S. Cl. .................. 257/686; 257/688; 257/738; 257/777; 257/780

(58) Field of Classification Search ........ 257/777–786, 257/737–738, 678, 684–688, 690
See application file for complete search history.

(56) References Cited

U.S. PATENT DOCUMENTS

| | | | |
|---|---|---|---|
| 5,384,690 A | 1/1995 | Davis et al. | |
| 5,620,782 A | 4/1997 | Davis et al. | |
| 5,933,712 A | 8/1999 | Bernhardt et al. | |
| 6,180,881 B1 | 1/2001 | Isaak | |
| 6,236,565 B1 | 5/2001 | Gordon | |
| 6,426,549 B1 | 7/2002 | Isaak | |
| 6,514,793 B2 | 2/2003 | Isaak | |
| 6,576,992 B1 | 6/2003 | Cady et al. | |
| 6,627,984 B2 | 9/2003 | Bruce et al. | |
| 2003/0025211 A1 | 2/2003 | Bruce et al. | |
| 2003/0111736 A1 | 6/2003 | Roeters et al. | |
| 2003/0113998 A1 | 6/2003 | Ross | |
| 2004/0238936 A1* | 12/2004 | Rumer et al. ............... 257/738 |

* cited by examiner

*Primary Examiner*—Cuong Nguyen
(74) *Attorney, Agent, or Firm*—Edell, Shapiro & Finnan, LLC

(57) ABSTRACT

A chip stack employing BGA or FBGA integrated circuit chip packages is provided. Two chip packages have bottom surfaces attached with sets of electrical contacts, which are oriented towards each other and are electrically connected to conductive patterns formed within the same flex substrate. One set contacts a conductive pattern on a top surface, the other set contacts a pattern on a bottom surface of the flex substrate within a same end portion. The other end portion has a conductive pattern, and is connected to a third set of electrical contacts. The flex substrate is wrapped around an edge of the chip package to connect the third set with the other two sets. Thereby, four chip packages are provided with this design, the layout of conductive traces formed within at least one of the flex substrates is meandered to compensate for length differences with respect to the other flex substrate.

28 Claims, 4 Drawing Sheets

CHIP STACK EMPLOYING A FLEX CIRCUIT

FIELD OF THE INVENTION

The present invention relates to stacking chips into modules. More particularly, the invention relates to packaged integrated circuit chips, which are stacked one above the other for preserving area on a printed wiring board, and which are electrically connected with each other by a flex circuit. Further, the invention relates to chip scale package designs.

BACKGROUND OF THE INVENTION

To preserve functional characteristics of an integrated circuit, chips are generally packaged into an encapsulating plastic environment, which also provides electrical connections from the chip to a printed wiring board (PWB), onto which the resultant package is to be mounted. An even number of such packaged chips mounted on a PWB typically make up a memory module, for example. The memory module may also comprise a hub distributing signals from a memory controller, via leads, to selected chips.

Particularly in the field of memory module design, there is a strong need to increase memory capacities per PWB, thereby decreasing chip sizes and/or increasing structure densities gained with regard to semiconductor memory design and manufacturing. This is particularly valid in the case of memory modules adapted to server applications, where there are special further requirements with respect to availability and lifetime. It is therefore additionally beneficial to preserve area on a PWB, which has limited dimensions available for positioning chips.

Commonly, an integrated circuit chip package is designed with interconnections to the PWB in the form of TSOP (thin small outline package). Therein, leads contacting electrical pads of the package emerge from peripheral edges of each package in order to contact corresponding pads provided on the PWB. As the rectangular flat body of a package already covers an area on the PWB, the leads and the PWB contacts are positioned beside each package, e.g. along its longitudinal peripheral edges. Such a design disadvantageously consumes valuable space of a PWB.

As a consequence, an alternative package design had been created, which scales the footprint of a package to dimensions of a chip or die encapsulated within the package. According to that design (chip scale packaging, CSP), a set of contacts is provided on a bottom surface of an integrated circuit chip package. These contacts are also known as balls and mainly have a spherical or semispherical form. The contacts are typically arranged as two arrays on the bottom surface, each array having two or three columns and up to, e.g., fifteen lines.

The corresponding pads on the PWB have a similar narrow array design. Advantageously, those pads need no longer be arranged beside the package, rather being located beneath a package according to the CSP design. The PWB area may then be preserved, e.g., for higher density of packages arranged on a circuit board.

Another approach to increase the memory capacity on a board is to stack packaged chips one above the other, or alternatively, to use both sides of a PWB for placing packages, thus employing the third dimension of a board. Stacking is performed by first placing a lowermost package onto a PWB with the set of arrayed contacts being electrically connected to corresponding pads on the board, for example. Then, a further package is placed upon the top surface of the lowermost chip package, the corresponding set of contacts being electrically connected to a so-called flex circuit, which is wrapped around the peripheral edge of the lowermost chip package.

The flex circuit connects both sets of contacts, i.e., the contacts of the lowermost chip package with the respective ones of the further chip package. In the case of two arrays of contacts extending on each side of the package bottom surface, two flex circuits are employed, one for each side. An example for such a module design is provided in U.S. Pat. No. 6,576,992 B1.

However, a problem arises due to signal runtime differences between a connection of the chip of the lowermost package with a controller and a connection of the chip of the further, upper package with that controller. Signal reflections occurring within various contacts along the signal path at different runtimes may considerably deteriorate signal quality.

This feature even worsens, if more than two chips, e.g., four chips or their respective packages, are stacked one above the other as the height of the chip stack considerably increases.

SUMMARY OF THE INVENTION

Therefore, the present invention provides a chip stack, which reduces the problems due to the runtime differences.

The present invention also increases the memory capacity of a module, and in particular increases the number of packaged chips available per printed wiring board.

Additionally, the present invention improves the signal quality of communication between a memory module and the memory controller.

Furthermore, the present invention provides memory modules for server applications with regard to signal quality in order to enhance availability and total lifetime of a memory module.

According to one aspect of the invention, there is provided a chip stack with at least two integrated circuit chip packages. The integrated circuit chip packages have a set of electrical contacts each, e.g. spherical or semispherical balls, disposed on their bottom surfaces. The contacts according to the invention are not limited to the particular three-dimensional form as described in the several embodiments disclosed in this document. The electrical contacts, or balls, may be further arranged as arrays.

The chip stack, according to this aspect of the invention, is further provided with a flex circuit that comprises conductive traces for providing electrical interconnection between the electrical contacts and the printed wiring board, and further comprises a flex substrate, isolating and mechanically supporting the conductive traces.

Both sets of contacts are connected to conductive patterns formed on the top and bottom surface of the flex substrate, respectively. The conductive patterns may consist of openings in the substrate giving access to the protuding electrical contacts, or balls, for connecting to the conductive traces within the flex substrate. However, the invention is not limited thereto, other arrangements to establish a connection between the conductive traces and the electrical contacts may be realized by a person skilled in the art starting from the configurations as proposed herein.

The conductive patterns provided on the top and bottom surface of the flex substrate are formed within the same portion of the flex substrate. As such, the patterns are positioned on the flex substrate opposite to each other within that portion. Preferably, this portion represents an end portion of the flex substrate, in which case the portion has an extent corresponding to the size of the conductive pattern, or the set of electrical contacts.

As both conductive patterns are placed on opposite sides of the flex substrates and as these are connected to electrical contacts provided on the bottom sides of the chip packages, according to the invention the bottom sides of both chip packages are oriented towards each other.

As a result, the top surfaces of the pair are oriented outwards and a connection to the PWB is established by means of the flex circuit extending out of the chip stack. Then, it is wrapped around the edge of the lowermost chip package of the pair in order to enable an electrical connection to the wiring on the board beneath the lowermost chip package. More precisely, it is wrapped at a location near the top surface of that package, which is oriented to the board in this case. For this purpose, the flex circuit comprises a third conductive pattern, which is formed because of the wrapping around on the top surface of the flex, which is now oriented to the "bottom" direction, i.e., towards the board. However, there is a further contact established to/or from the board within this portion of the flex, which accesses the flex substrate from the its own bottom surface, which has a "top" orientation when being wrapped around.

Due to this advantageous stacking technique according to this embodiment of the invention, stacking of chips is enabled, while there are substantially no runtime differences. This is because both sets of electrical contacts are connected to the same portion of the flex circuit and thus attain the same distance with respect to, e.g., a hub or a controller.

According to another aspect of the invention, there is provided a chip stack having four integrated circuit chip packages. The stack therein comprises two pairs of chip packages, which are similar to the first aspect, each oriented towards each other in between one pair, respectively. Accordingly, two flex circuits are needed, thereby providing electrical access to four sets of electrical contacts, one for each chip package.

While this aspect provides for even larger memory capacities per printed circuit or wiring board, different heights of the stacked packages lead to different flex substrate lengths. The resultant signal runtime differences are remedied by means of meandering, i.e. prolonging, the conductive traces in the shorter flex, i.e., the flex circuit providing connection to the lowermost pair of chip packages.

The length of the conductive traces between the contact to the board and the set of contacts on the packages within both flex circuits are equal with respect to each other. It is within the scope of the invention to provide a variety of path designs and the wording of "meandering" is not to be interpreted in a narrow sense. Rather, any trace path layout within the flex substrate, that prolongs trace path length at a given direct distance is of possible use with regard to the invention. The layout is not necessarily limited to regular forms.

Also within the scope of the invention, is to provide both flex circuits with meandered trace path layouts, but wherein the amount of meandering differs by just that length deviation, which is employed to outweigh differing signal runtimes.

According to a still further aspect, a flex circuit is provided, that comprises conductive traces for providing electrical interconnection between the electrical contacts and the printed wiring board, and further comprises a flex substrate isolating and mechanically supporting the conductive traces.

According to a previous aspect, the flex circuit has conductive patterns provided on a top and a bottom surface of the flex substrate, respectively, which are formed within the same portion of the flex substrate. As such, the patterns are positioned on the flex substrate on opposite sides with respect to each other. Preferably, that portion represents an end portion of the flex substrate, in which case the portion has an extent corresponding to the size of the conductive pattern or the set of electrical contacts.

The flex further has a third conductive pattern, which is positioned in a second portion of the flex substrate, preferably another end portion opposite to that portion of the first and second conductive patterns. A characterizing feature is that the third conductive pattern is disposed on the top surface of the flex substrate. As a result, the flex substrate can be wrapped around a peripheral edge of a chip package such that the conductive pattern formed on the top surface is now oriented towards a printed wiring board (PWB), or more precisely, to electrical contacts mounted on the PWB.

In an even more refined aspect, the conductive traces provided within the flex substrate have a meandered layout in order to compensate length differences with respect to another flex circuit contacting the same PWB-contacts but a different chip package within the same stack.

The above and still further aspects, features, and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

These and other features of the present invention will become more apparent upon reference to the drawings wherein.

DETAILED DESCRIPTION

Figure 1:
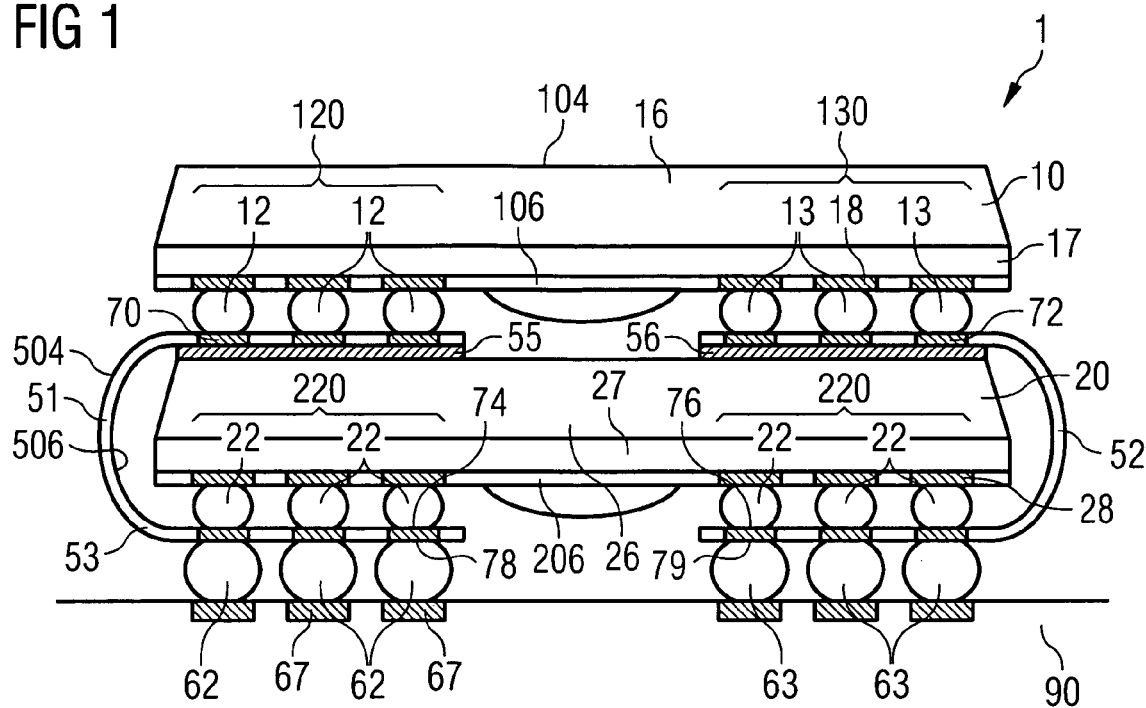
FIG. 1 shows a sectional view of a first chip stack according to prior art.

FIG. 1 shows a sectional side view of a chip stack according to prior art, which is similar to FIG. 1 of U.S. Pat. No. 6,576,992 B1 assigned to Staktek Group L. P., Austin, Tex. On a printed wiring board (PWB) 90 is arranged a chip stack 1 comprising a first integrated circuit chip package 10 and a second integrated circuit chip package 20. Both chip packages 10, 20 have each a top surface 104, 106 and a bottom surface 204, 206.

The top surfaces 104, 106 are provided by a housing 16, 26 in each case, respectively, wherein the chip (not shown) resides. The bottom surfaces 106, 206 are provided by a wiring substrate 17, 27, respectively. The wiring substrates 17, 27 comprise a wiring 18, 28 that connects bond pads (not shown) of the chip, i.e., chip functionality, with sets of electrical contacts 12, 13, 22, 23, respectively. Electrical contacts 12, 13, 22, 23 are each arranged in sets 120, 130, 220, 230 or more precisely, arrays. In the sectional views provided herein, the arrays are made of contacts arranged in 3 columns (shown) and 11 lines (not shown) each, for example. However, neither this embodiment or other embodiments are limited to an array being arranged as described herein.

Both chip packages are stacked one above the other. They represent each chip scale packages (CSP) or more precisely, fine-pitch ball grid arrays (FBGA). Both packages are connected to wiring 67 provided on the PWB 90. For that purpose, further electrical contacts 62, 63 or balls are provided to connect to a flex circuit 51, that is disposed to distribute electrical signals 80 via conductive traces formed in the flex circuit of the first chip package 10 and through vias formed within the flex circuit 51 to the second chip package 20.

Electrical contacts 62, 63 form sets of contacts 620, 630 or arrays. In order to conform with a given standard, such as JEDEC, the layout of arrays 120, 130, 22, 230, 620, 630 is in each case are aligned. Further, each of the arrays 120, 130 of the first chip package is connected by one flex circuit with one of the arrays 220, 230 of the second chip package. Consequently, there are two flex circuits 51, 52 provided in this embodiment. Both flex circuits 51, 52 are wrapped around peripheral edges of the second chip package 20 in order to reach the sets 220 and 230 of the second package and the wiring 67 beneath the stack. Further, both flex circuits are attached to the top surface 204 of the second chip package by means of an adhesive layer 55, 56.

In order to enable an electrical connection via the flex circuit, the flex substrate 53 each of the flex circuits 51 and 52 comprises conductive patterns 70, 72, 74, 76, 78, 79 formed in a top surface 504 and bottom surface 506 of the flex substrate 53. Therein, e.g., conductive pattern 70 connecting the set 120 of contacts to the conductive traces is formed in a top surface 504, while conductive pattern 74 is formed within a bottom surface. However, conductive patterns 70 and 74 are formed in different, or more precisely, opposite end portions of the flex substrate 53.

Accordingly, both chip packages have identical orientation on the PWB, the bottom surface in each case being oriented towards the board. As a further result, the chip packages according to this prior art example may be fabricated identically.

Figure 2:
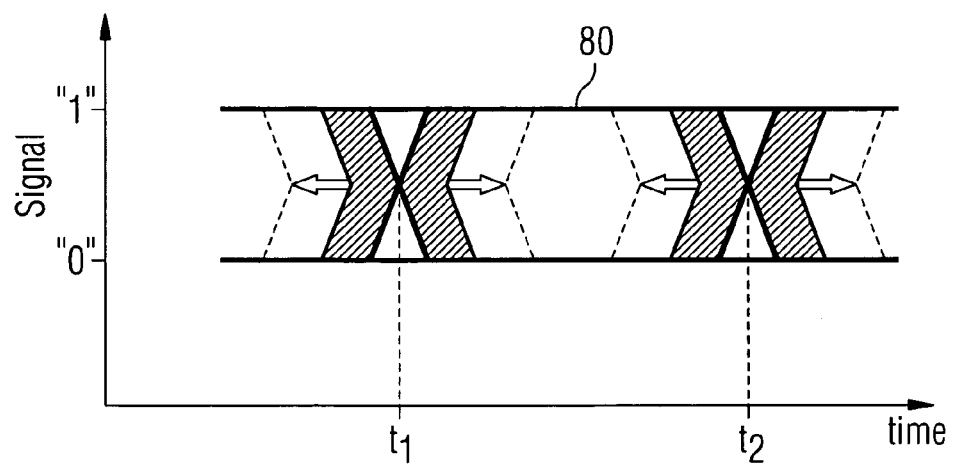
FIG. 2 shows a scheme indicating the problem of signal quality according to prior art.

A disadvantage resulting from this prior art example is illustrated in FIG. 2. There is shown the distribution of signal strengths with respect to a clock period ranging from first time stamp t1 to second time stamp t2. The bold lines show an ideal behavior of signal changes (from "1" to "0" or from "0" to "1"), identified by the X-like feature in that graph. In a "one-chip-stack", due to stochastic fluctuations, this transition feature broadens as is indicated by hatched area.

However, as indicated by the arrows in FIG. 2, the transition feature further broadens, while a remaining time portion, that provides an undoubted signal interpretation, shrinks to less than 50 percent of the clock period (indicated by dashed lines).

Figure 3:
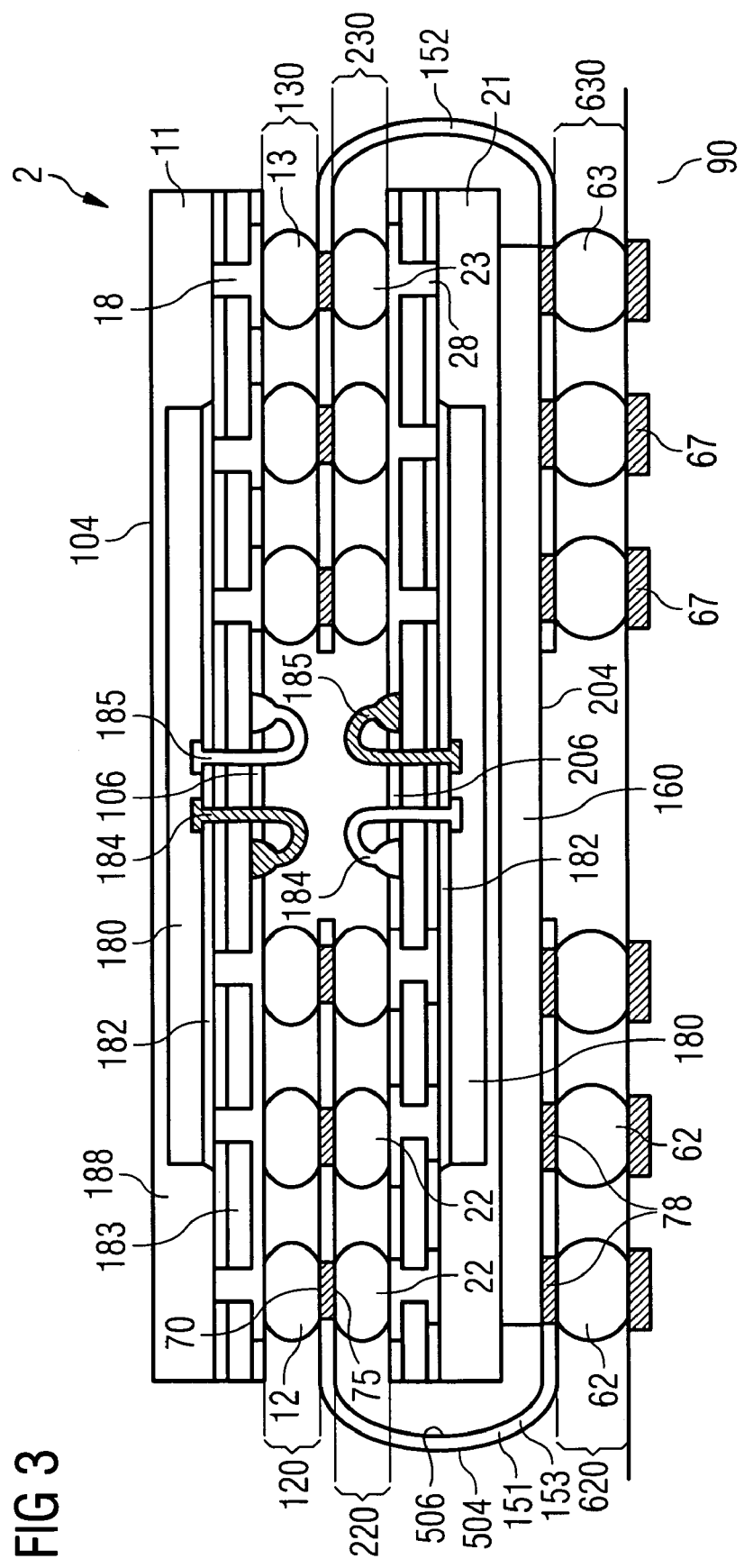
FIG. 3 shows a sectional view of a first embodiment according to the invention.

A first embodiment of the invention is shown in FIG. 3, which counteracts the effect as indicated by the arrows in FIG. 2. The chip stack 2 comprises a first integrated circuit chip package 11 and a second integrated circuit chip package 21. In contrast to the prior art example, the pair of chip packages 11, 21 in this embodiment are oriented towards each other. The bottom surfaces 106, 206 as well as the sets 120, 220 of electrical contacts 12, 22 of the different chip packages, are oriented towards each other. The flex circuits 151, 152 are sandwiched between the electrical contacts 12, 22 and 13, 23.

To accomplish this arrangement, the flex circuit 151, or the flex substrate 153, comprises conductive patterns 70 on a top surface 504 to provide connection to balls 12 and further conductive pattern 75 on a bottom surface 506 to provide electrical connection to balls 22.

Both patterns are formed within the same (end) portion of the flex substrate 153 and are further aligned with each other. As in the previous example, the layout of the arrays of electrical contacts 12, 22 and the conductive patterns 70, 75 conform with a JEDEC standard. This is also valid for the third set 620 (and the corresponding set 630) of contacts 62 or balls that provides the connection to the wiring 67 of the PWB 90. However, as the chip package 21 is now flipped in its orientation, the top surface 204 is directed to that set 620 of electrical contacts hidden behind the flex circuit 151 and connected to conductive pattern 78 formed on the top surface 504 of the flex substrate 153. An adhesive layer 160 therefore provides mechanical stability.

As becomes clear from FIG. 3, the characteristic of the second chip package being flipped, including an adhesive layer on its top surface 204, results in mirrored electrical contacts, as well. This feature is illustrated by the bond contacts 184, 185 hatched in FIG. 3, which provide for an electrical connection between the wiring 18, 28 and the integrated circuit chips 180. Since each of the two contacts 12, 22 connect to the same conductive trace formed within the flex substrate 153 and represent the same logical functionality with respect to the chip 180, the chip will generally not have to be mirrored. The layout of the wiring 18, 28 and bonds 184, 185 has undergone a "mirror-like" transition according to this embodiment.

Reference numeral 182 denotes an adhesive layer, 188 denotes the housing substrate (preferably plastic) and 189 denotes the wiring substrate comprising the wiring 18, 28 and the bonds 184, 185.

The term "mirror-like" refers to the layout of both of the wiring substrates 189, including the wiring 18, 28 and the bonds 184, 185, and need not necessarily be mirrored. As two different wiring substrates 189 are to be fabricated for the purpose of this embodiment, a mirrored logic is sufficient, while the exact layout will typically not be axial symmetric if the chip 180 attached to the wiring substrate 189 of the second chip package and thus the bond pads thereupon remain unchanged when the package is flipped.

Figure 4:
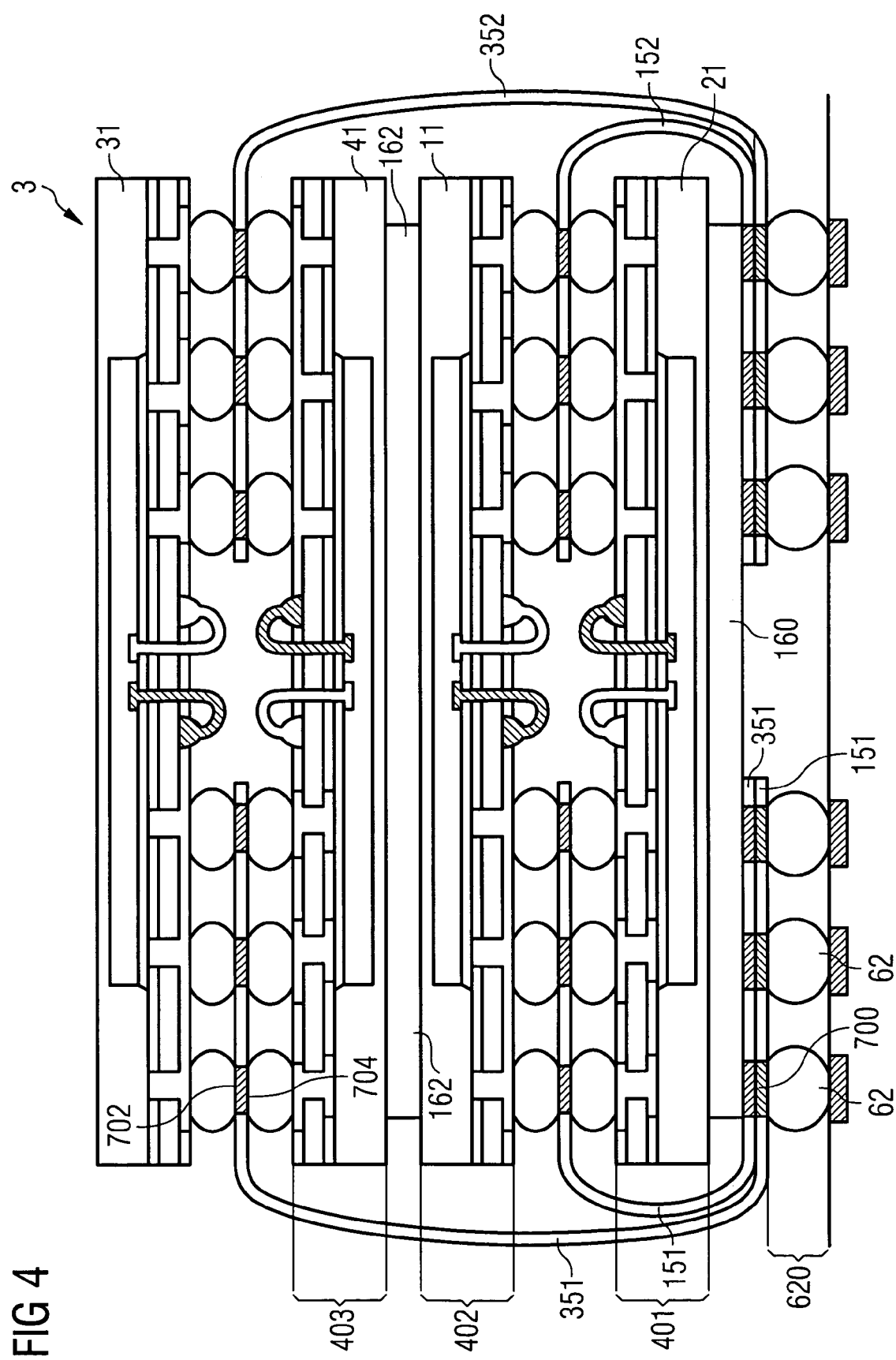
FIG. 4 shows a sectional view of a second embodiment according to the invention.

FIG. 4 shows a second embodiment with respect to a second aspect of the invention. Instead of a dual-stack chip package as shown FIG. 3, a quad-stack chip package is provided having two pairs of chip packaged oriented towards and mirrored with respect to each other as demonstrated for the dual-stack case in the first embodiment. In what follows, only differences with respect to the first embodiment are explained, while other features remain similar and are also incorporated in this embodiment.

The chip stack 3 has four integrated circuit chip packages 21, 11, 41, 31. The pair of packages 21, 11 is similar to the previous embodiment, while the pair of packages 41, 31 is set on top of the first pair. An adhesive layer 162 is provided between the top surface of the first chip package 11 and the top surface of the fourth chip package 41.

The quad chip stack 3 shown in FIG. 4 has two flex circuits 151, 351 on each side of the stack, where each flex circuit connects a pair of sets of electrical contacts with set 620 of electrical contacts attached to the pads 62 adjacent to wiring of the PWB 90. The first flex circuit 151 is wrapped around peripheral edge 401 of the second integrated circuit chip package 21, as in the previous embodiment. However, the second flex circuit is wrapped around a combination of peripheral edges 401, 402, 403 made of the first 11, second 21 and fourth 41 chip package of the stack 3.

Both flex circuits are aligned with each other beneath the lowermost (the "second") chip package. Both flex circuits are provided with a conductive pattern 700 that is arranged to connect to set 620 of electrical contacts. In particular, electrical contacts 62 of the set 620 have an electrical connection to both the conductive traces of the first and the second circuit. For example, the lower second flex circuit 351 can have a conductive pattern, which is provided with openings or vias such that electrical contacts 62 reach through the flex circuit 351 and simultaneously contact flex circuit 151. Alternatively, further balls can be provided at the position of the respective conductive patterns between both flex circuits.

As becomes clear from FIG. 4, the flex circuits 151 and 351 exhibit a length difference due to a height difference above the PWB 90, to which they connect the chip packages.

Figure 5:
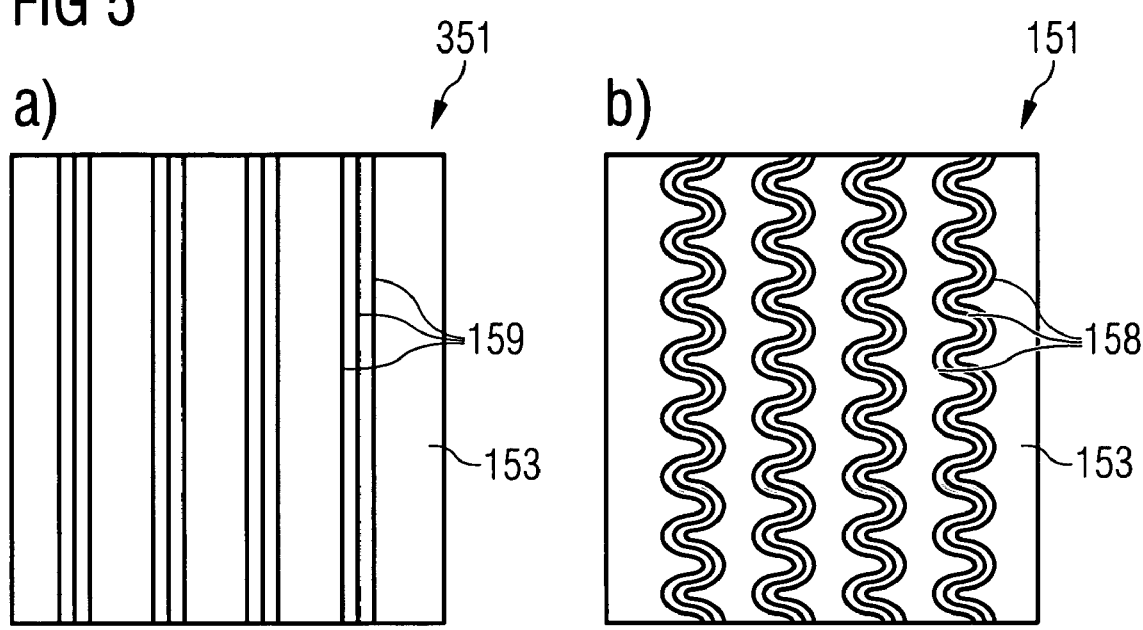
FIGS. 5 *a* and *b* show a schematic illustration of a top sectional view of the two flex circuits of the embodiment shown in FIG. 4.

FIGS. 5a and b show a top sectional view of a portion of the layout of conductive traces within both flex circuits for comparison. FIG. 5a shows the conventional layout of straight conductive traces 159 extending from the conductive pattern 700 to conductive patterns 702, 704 formed on opposite surfaces within an end portion of the same flex circuit 351. Each three parallel traces are designed to be connected to a subset of three electrical contacts arranged in a line of an array.

FIG. 5b shows a meandered layout of conductive traces 158 formed in flex substrate 153 of flex circuit 151. The meandered layout serves for increasing the length of the traces, which is adapted to become equal to that of traces 159. Accordingly, the effect indicated by the arrows in FIG. 2 is advantageously compensated.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Numerals 1 chip stack (prior art)
2, 3 chip stack (invention)
10, 20 integrated circuit chip packages (prior art)
11, 21, 31, 41 integrated circuit chip packages (invention)
12, 13, 22, 23 electrical contacts
16 housing
18, 28 wiring
51, 151, 351 flex circuit
53, 153 flex substrate
55, 56 adhesive layer
67 wiring and pads on PWB
70-79, 700, 702, 704 conductive pattern
80 signal
90 PWB
104, 106, 204, 206 top/bottom surface of chip package
120, 130, 220, 230, 620, 630 set of contacts
158, 159 conductive traces
160, 162 adhesive layer
180 integrated circuit chip
182 adhesive layer -continued List of Reference Numerals 184, 185 bonds
188 housing substrate
189 wiring substrate
401-403 peripheral edges of packages
504, 506 top/bottom surface of flex substrate

What is claimed is:

1. A chip stack, comprising:
a flex circuit comprising: a flex substrate; a plurality of conductive traces formed within the flex substrate; a first conductive pattern formed on a top surface of the flex substrate; a second conductive pattern formed on a bottom surface of the flex substrate, both the first and second conductive patterns being formed on opposite surfaces within a first portion of the flex substrate, and both conductive patterns being electrically coupled to the conductive traces formed within the flex substrate; and a third conductive pattern disposed on the top surface within a second portion of the flex substrate, the third conductive pattern being electrically coupled to the conductive traces;
a first integrated circuit chip package comprising a first set of contacts, the first set of contacts being arranged to electrically couple to the first conductive pattern formed on the top surface of the flex substrate;
at least one second integrated circuit chip package comprising a second set of contacts arranged to electrically couple to the second conductive pattern formed on the bottom surface of the flex substrate, wherein at least the second portion of the flex substrate is wrapped around a peripheral edge of the second integrated circuit chip package; and
an adhesive layer provided on the top surface of the second integrated circuit chip package, wherein the second portion of the flex substrate is attached to the adhesive layer.

2. The chip stack according to claim 1, wherein the first and second integrated circuit chip packages each comprise a bottom surface that is provided with the respective sets of contacts and a top surface opposite to the bottom surface, and both of the bottom surfaces of the first and second integrated circuit chip packages are oriented towards each other, the first portion of the flex substrate being arranged between both bottom surfaces and between the sets of contacts of the first and second integrated circuit chip packages.

3. The chip stack according to claim 1, wherein the second portion of the flex substrate is attached to the top surface of the second integrated circuit chip package.

4. The chip stack according to claim 1, further comprising:
a third set of contacts electrically coupled to the third conductive pattern, which is formed on the top surface of the flex substrate within the second portion wrapped around the peripheral edge of the integrated circuit chip package.

5. The chip stack according to claim 1, wherein each of the contacts of the first set provided on the bottom surface of the first integrated circuit chip package is aligned with respective contacts of the second set provided on the bottom surface of the second integrated circuit chip package.

6. The chip stack according to claim 5, wherein the first conductive pattern on the top surface of the flex substrate and the second conductive pattern on the bottom surface of the flex substrate are aligned with each other, such that each of the contacts of the first set and the respective contacts of the second set are in each case electrically coupled to the same one of the conductive traces.

7. The chip stack according to claim 6, wherein:
each of the integrated circuit chip packages comprise a set of contacts, an integrated circuit chip, a housing substrate and a wiring substrate, which is provided with wiring and bonds to electrically connect contacts formed on the chip with each one of the respective sets of contacts;
each of the integrated circuit chips are identical copies of each other; and
the wiring substrate of the first integrated circuit chip package is provided with wiring and bonds that associate contacts on the chip with contacts on the bottom surface of the package in a mirror-like manner as compared with the wiring and bonds provided by the wiring substrate of the second integrated circuit chip package.

8. The chip stack according to claim 1, wherein each of the integrated circuit chip packages comprises a chip scale packing (CSP) device.

9. The chip stack according to claim 8, wherein each of the integrated circuit chip packages is selected from one of the group comprising:
a ball grid array (BGA) device; and
a fine-pitch ball grid array (FBGA) device.

10. The chip stack according to claim 1, further comprising:
a second flex circuit comprising: a second flex substrate; a plurality of conductive traces formed within the second flex substrate; a fourth conductive pattern formed on a top surface of the second flex substrate; a fifth conductive pattern formed on a bottom surface of the second flex substrate, the fourth and fifth conductive patterns being formed on opposite surfaces within a first portion of the second flex substrate, and both conductive patterns being electrically coupled to the conductive traces formed within the second flex substrate; and a sixth conductive pattern disposed on the top surface within a second portion of the second flex substrate, the sixth conductive pattern being electrically connected to the conductive traces;
a third integrated circuit chip package including a fourth set of contacts electrically coupled to the fourth conductive pattern formed on the top surface of the second flex substrate; and
a fourth integrated circuit chip package including a fifth set of contacts electrically coupled to the fifth conductive pattern formed on the bottom surface of the second flex substrate;
wherein at least the second portion of the second flex substrate is wrapped around a peripheral edge, which is provided by a stack of the first, second and fourth integrated circuit chip packages.

11. The chip stack according to claim 10, wherein:
the third and fourth integrated circuit chip packages each comprise a bottom surface that is provided with the respective fourth and fifth sets of contacts and a top surface opposite to the bottom surface; and
both of the bottom surfaces of the third and fourth integrated circuit chip packages are oriented towards each other, the first portion of the second flex substrate being arranged between both bottom surfaces and between the fourth and fifth sets of contacts of the third and fourth integrated circuit chip packages.

12. The chip stack according to claim 10, wherein the second portion of the second flex substrate is attached to the top surface of the second integrated circuit chip package.

13. The chip stack according to claim 10, wherein:
the third conductive pattern of the second portion of the first flex substrate and the sixth conductive pattern of the second portion of the second flex substrate are aligned with each other; and
a third set of contacts is electrically connected to the third and the sixth conductive pattern, which are formed on the top surfaces of the first and second flex substrates, respectively.

14. The chip stack according to claim 10, wherein each of the contacts of the fourth set provided on the bottom surface of the third integrated circuit chip package is aligned with respective contacts of the fifth set provided on the bottom surface of the fourth integrated circuit chip package.

15. The chip stack according to claim 14, wherein the fourth conductive pattern on the top surface of the second flex substrate and the fifth conductive pattern on the bottom surface of the second flex substrate are aligned with each other, such that each of the contacts of the fourth set and the respective contacts of the fifth set are in each case electrically connected to the same one of the conductive traces of the second flex circuit.

16. The chip stack according to claim 15, wherein:
each of the integrated circuit chip packages comprises a set of contacts, an integrated circuit chip, a housing substrate and a wiring substrate, which is provided with wiring and bonds to electrically connect contacts formed on the chip with each one of the respective sets of contacts;
each of the integrated circuit chips are identical copies of each other; and
the wiring substrate of the third integrated circuit chip package is provided with wiring and bonds that associate contacts on the chip with contacts on the bottom surface of the package in a mirror-like manner as compared with the wiring and bonds provided by the wiring substrate of the fourth integrated circuit chip package.

17. The chip stack according to claim 10, wherein:
the first flex substrate has a first length between the position of the first portion of the first flex substrate and second conductive patterns of the first portion and the position of the third conductive pattern of the second portion of the first flex substrate;
the second flex substrate has a second length between the position of the fourth and fifth conductive patterns of the first portion of the second flex substrate and the position of the sixth conductive pattern of the second portion of the second flex substrate; and
the second length is larger than the first length.

18. The chip stack according to claim 17, wherein:
the conductive traces formed within the first flex substrate include a third length;
the conductive traces formed within the second flex substrate include a fourth length; and
the fourth length is substantially identical to the third length for providing equal signal runtimes along the conductive traces of the first and second flex circuits.

19. The chip stack according to claim 18, wherein the second flex circuit is provided with a meandered layout of conductive traces.

20. A flex circuit for providing an electrical connection between at least one integrated circuit chip package and a printed wiring board, comprising:
- a flex substrate;
- a plurality of conductive traces formed within the flex substrate, wherein at least one of the conductive traces is provided with a meandering layout;
- a first conductive pattern formed on a top surface of the flex substrate, for providing access to a first set of contacts of a first integrated circuit chip package;
- a second conductive pattern formed on a bottom surface of the flex substrate, for providing access to a second set of contacts of a second integrated circuit chip package;
- the first and second conductive patterns being formed on opposite surfaces within a first portion of the flex substrate, and the first and second conductive patterns being electrically connected to the conductive traces formed within the flex substrate; and
- a third conductive pattern disposed within a second portion of the flex substrate, for providing access to a third set of contacts of the printed wiring board, the third conductive pattern being electrically connected to the conductive traces;
- wherein the third conductive pattern is disposed on the top surface of the flex substrate, for providing access to the third set of contacts when the flex circuit is wrapped around a peripheral edge of one of the integrated circuit chip packages.

21. The flex circuit according to claim 20, wherein the first, second and third conductive patterns are provided by openings formed in each one of the surfaces of the flex substrate, such that access to the conductive traces is provided to each set of contacts, which protrude from a chip package or from the printed wiring board.

22. The flex circuit according to claim 20, wherein the meandering layout is a serpentine pattern.

23. A chip stack, comprising:
- a flex circuit comprising: a flex substrate; a plurality of conductive traces formed within the flex substrate; a first conductive pattern formed on a top surface of the flex substrate; a second conductive pattern formed on a bottom surface of the flex substrate, both the first and second conductive patterns being formed on opposite surfaces within a first portion of the flex substrate, and both conductive patterns being electrically coupled to the conductive traces formed within the flex substrate; and a third conductive pattern disposed on the top surface within a second portion of the flex substrate, the third conductive pattern being electrically coupled to the conductive traces;
- a first integrated circuit chip package comprising a first set of contacts, the first set of contacts being arranged to electrically couple to the first conductive pattern formed on the top surface of the flex substrate; and
- at least one second integrated circuit chip package comprising a second set of contacts arranged to electrically couple to the second conductive pattern formed on the bottom surface of the flex substrate, wherein at least the second portion of the flex substrate is wrapped around a peripheral edge of the second integrated circuit chip package;
- wherein each of the contacts of the first set provided on the bottom surface of the first integrated circuit chip package is aligned with respective contacts of the second set provided on the bottom surface of the second integrated circuit chip package.

24. The chip stack according to claim 23, wherein the first conductive pattern on the top surface of the flex substrate and the second conductive pattern on the bottom surface of the flex substrate are aligned with each other, such that each of the contacts of the first set and the respective contacts of the second set are in each case electrically coupled to the same one of the conductive traces.

25. The chip stack according to claim 23, wherein:
- each of the integrated circuit chip packages comprise a set of contacts, an integrated circuit chip, a housing substrate and a wiring substrate, which is provided with wiring and bonds to electrically connect contacts formed on the chip with each one of the respective sets of contacts;
- each of the integrated circuit chips are identical copies of each other; and
- the wiring substrate of the first integrated circuit chip package is provided with wiring and bonds that associate contacts on the chip with contacts on the bottom surface of the package in a mirror-like manner as compared with the wiring and bonds provided by the wiring substrate of the second integrated circuit chip package.

26. A chip stack, comprising:
- a flex circuit comprising: a flex substrate; a plurality of conductive traces formed within the flex substrate; a first conductive pattern formed on a top surface of the flex substrate; a second conductive pattern formed on a bottom surface of the flex substrate, both the first and second conductive patterns being formed on opposite surfaces within a first portion of the flex substrate, and both conductive patterns being electrically coupled to the conductive traces formed within the flex substrate; and a third conductive pattern disposed on the top surface within a second portion of the flex substrate, the third conductive pattern being electrically coupled to the conductive traces;
- a first integrated circuit chip package comprising a first set of contacts, the first set of contacts being arranged to electrically couple to the first conductive pattern formed on the top surface of the flex substrate;
- at least one second integrated circuit chip package comprising a second set of contacts arranged to electrically couple to the second conductive pattern formed on the bottom surface of the flex substrate, wherein at least the second portion of the flex substrate is wrapped around a peripheral edge of the second integrated circuit chip package;
- a second flex circuit comprising: a second flex substrate; a plurality of conductive traces formed within the second flex substrate; a fourth conductive pattern formed on a top surface of the second flex substrate; a fifth conductive pattern formed on a bottom surface of the second flex substrate, the fourth and fifth conductive patterns being formed on opposite surfaces within a first portion of the second flex substrate, and both conductive patterns being electrically coupled to the conductive traces formed within the second flex substrate; and a sixth conductive pattern disposed on the top surface within a second portion of the second flex substrate, the sixth conductive pattern being electrically connected to the conductive traces;
- a third integrated circuit chip package including a fourth set of contacts electrically coupled to the fourth conductive pattern formed on the top surface of the second flex substrate; and a fourth integrated circuit chip package including a fifth set of contacts electrically coupled to the fifth conductive pattern formed on the bottom surface of the second flex substrate;

wherein at least the second portion of the second flex substrate is wrapped around a peripheral edge, which is provided by a stack of the first, second and fourth integrated circuit chip packages.

27. The chip stack according to claim 26, wherein:

the third and fourth integrated circuit chip packages each comprise a bottom surface that is provided with the respective fourth and fifth sets of contacts and a top surface opposite to the bottom surface; and both of the bottom surfaces of the third and fourth integrated circuit chip packages are oriented towards each other, the first portion of the second flex substrate being arranged between both bottom surfaces and between the fourth and fifth sets of contacts of the third and fourth integrated circuit chip packages.

28. The chip stack according to claim 26, wherein the second portion of the second flex substrate is attached to the top surface of the second integrated circuit chip package.

* * * * *